United States Patent
Tajima et al.

(10) Patent No.: US 7,588,962 B2
(45) Date of Patent: Sep. 15, 2009

(54) METHOD OF MAKING SEMICONDUCTOR DEVICE

(75) Inventors: Masaya Tajima, Aichi (JP); Katsuya Kogiso, Aichi (JP); Mitsuo Watanabe, Aichi (JP); Toshiki Matsubara, Aichi (JP); Kenji Sato, Aichi (JP)

(73) Assignee: Kabushiki Kaisha Tokai Rika Denki Seisakusho (JP)

( * ) Notice: Subject to any disclaimer, the term of this patent is extended or adjusted under 35 U.S.C. 154(b) by 0 days.

(21) Appl. No.: 12/204,502

(22) Filed: Sep. 4, 2008

(65) Prior Publication Data

US 2009/0023253 A1    Jan. 22, 2009

Related U.S. Application Data

(62) Division of application No. 10/246,126, filed on Sep. 18, 2002, now abandoned.

(30) Foreign Application Priority Data

Sep. 20, 2001    (JP) .............................. 2001-287076

(51) Int. Cl.
    *H01L 21/50* (2006.01)
(52) U.S. Cl. .................. 438/106; 438/118; 438/125; 257/E21.499
(58) Field of Classification Search ................. 438/106, 438/125–126, 118
    See application file for complete search history.

(56) References Cited

U.S. PATENT DOCUMENTS

| | | | |
|---|---|---|---|
| 3,689,311 A | 9/1972 | Loeffler et al. | |
| 4,788,583 A | 11/1988 | Kawahara et al. | |
| 5,519,177 A | 5/1996 | Wang et al. | |
| 5,641,997 A | 6/1997 | Ohta et al. | |
| 5,786,626 A | 7/1998 | Brady et al. | |
| 5,874,784 A | 2/1999 | Aoki et al. | |
| 6,420,204 B2 * | 7/2002 | Glenn | 438/64 |
| 6,605,343 B1 | 8/2003 | Motoi et al. | |
| 6,607,825 B1 | 8/2003 | Want et al. | |
| 6,643,919 B1 * | 11/2003 | Huang | 29/827 |
| 7,537,964 B2 * | 5/2009 | Minervini | 438/113 |
| 2001/0033722 A1 | 10/2001 | Okada et al. | |
| 2002/0024439 A1 | 2/2002 | Kawai et al. | |
| 2002/0030258 A1 | 3/2002 | Fukasawa et al. | |
| 2002/0037143 A1 | 3/2002 | Kuhara et al. | |
| 2002/0195744 A1 | 12/2002 | Otsuki et al. | |

FOREIGN PATENT DOCUMENTS

| | | |
|---|---|---|
| EP | 0407585 A | 1/1991 |
| EP | 02020768 | 4/2006 |
| JP | 07196898 A | 12/1995 |
| JP | 08078582 A | 7/1996 |
| JP | 11035915 A | 5/1999 |

* cited by examiner

*Primary Examiner*—Thanh Nguyen
(74) *Attorney, Agent, or Firm*—Carstens & Cahoon LLP

(57) ABSTRACT

A method for manufacturing a semiconductor device that includes a housing, formed of a polyamide-series thermoplastic resin, and a semiconductor package sealed in the housing, which is formed of a thermosetting epoxy resin. The surface of the package is modified by UV-irradiation to have adhesive properties to polyamide. A plurality of connector terminals extend from the package and housing in parallel. A portion of the terminals is also sealed in the housing together with the package. Thus, the device is easily produced by insert molding and has excellent moisture resistance.

3 Claims, 2 Drawing Sheets

US 7,588,962 B2

METHOD OF MAKING SEMICONDUCTOR DEVICE

CROSS-REFERENCE TO RELATED APPLICATIONS

This application is a divisional application that claims the benefit of and priority to U.S. patent application Ser. No. 10/246,126 filed Sep. 18, 2002, now abandoned, (published as U.S. Publication No. 2003/0052396 on Mar. 20, 2003), which claims the benefit of Japanese Patent Application No. 2001-287076 filed Sep. 20, 2001 (published as Japanese Publication No. 2003-94479 on Apr. 3, 2003), the technical disclosures of which are hereby incorporated herein by reference.

TECHNICAL FIELD

The present invention relates to the sealing of semiconductor device in which a semiconductor package and a housing containing the semiconductor package are formed of different synthetic resins. More particularly, the present invention relates to a semiconductor device in which a housing is formed of thermoplastic resin (a first synthetic resin) and a semiconductor package is formed of thermosetting epoxy resin (a second synthetic resin), and a method of making the same.

BACKGROUND OF THE INVENTION

Semiconductor devices are sometimes made by insert molding by using thermoplastic resin to seal the semiconductor package made of thermosetting epoxy resin in the housing. However, thermosetting epoxy resin, which is a raw material of the semiconductor package, and thermoplastic resin, which is a raw material of the housing, have different reactions to heat. Thus, the adhesive properties between the two resins become poor after cooling and a gap may form between them. In such a semiconductor device, problems such as a leak or a short may occur due to moisture that comes in from the gap between the package and the housing in certain circumstances.

To prevent this problem, some prior art semiconductor devices have been made using a method different from insert molding. First, as shown in FIG. 3A, a housing 51 having a connector terminal 50 is provided. The connector terminal 50 is preformed by injection molding in a predetermined position of the housing 51. When a semiconductor package 52 is placed in the housing 51, a surface of the package 52 that abuts against the housing 51 has an adhesive agent applied thereon. After the connecting portion 52a of the package 52 is placed in contact with the connector terminal 50, the package 52 is fixed to the housing 51. Next, as shown in FIG. 3B, a space 53 in the housing 51 is filled with a sealant 54 such as liquid epoxy and silicone to seal the package 52.

The above-mentioned manufacturing method, in which the package 52 is sealed with the sealant 54, requires more steps (three) compared to the manufacturing method by using insert molding: a step of making the housing 51 having the connector terminal 50, a step of adhering the package 52 to the housing 51, and a step of filling the housing 51 with the sealant 54. This complicates the manufacturing process as well as increases the manufacturing costs of the semiconductor device.

SUMMARY OF THE INVENTION

An object of the present invention is to provide a semiconductor device that is easy to manufacture and has excellent moisture resistance.

Another object of the present invention is to provide a semiconductor device that holds downs its manufacturing costs.

To achieve the foregoing and other objectives and in accordance with the purpose of the present invention, a semiconductor device is provided. The semiconductor device includes a housing and a semiconductor package. The housing is formed of a first synthetic resin that is a thermoplastic resin. The semiconductor package is formed of a second synthetic resin that is a thermosetting resin. The package is sealed in the housing. The package has a modified face that has adhesive properties to the first synthetic resin. The modified face is formed on a surface of the package by UV-irradiating the surface before the sealing of the package in the housing.

The present invention also provides a method of making a semiconductor device. The method includes steps of: UV-irradiating a semiconductor package formed of thermosetting epoxy resin to modify its surface to be adhesive to polyamide; placing the package in a die; and filling a space in the die with melted polyamide or a melted thermoplastic resin including polyamide to seal the package by insert molding.

Other aspects and advantages of the invention will become apparent from the following description, taken in conjunction with the accompanying drawings, illustrating by way of example the principles of the present invention.

BRIEF DESCRIPTION OF THE DRAWINGS

The invention, together with objects and advantages thereof, may best be understood by reference to the following description of the presently preferred embodiments together with the accompanying drawings which.

DETAILED DESCRIPTION OF THE DRAWINGS

An embodiment of the present invention is described with reference to FIGS. 1 and 2 hereinafter.

Figure 1A:
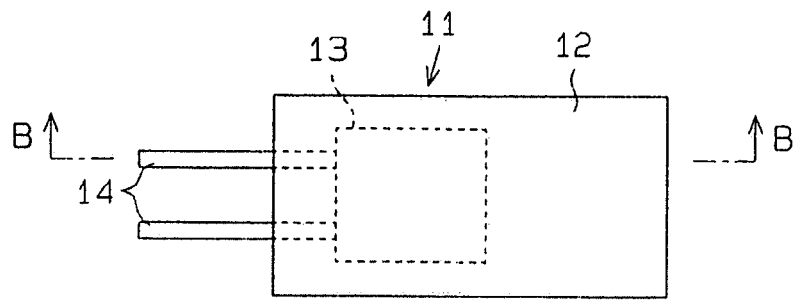
FIG. 1A is a schematic plan view of a semiconductor device.
Figure 1B:
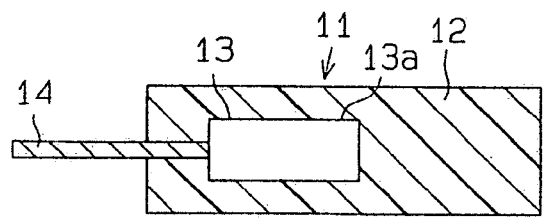
FIG. 1B is a schematic cross-sectional view of the semiconductor device of FIG. 1A taken along the line B-B.
Figure 2:
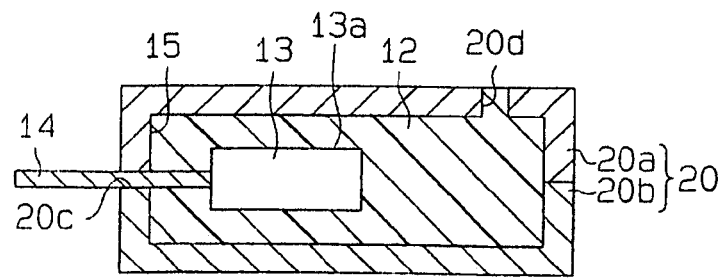
FIG. 2 is a schematic cross-sectional view showing insert molding during the manufacturing process of the semiconductor device.
Figure 3A:
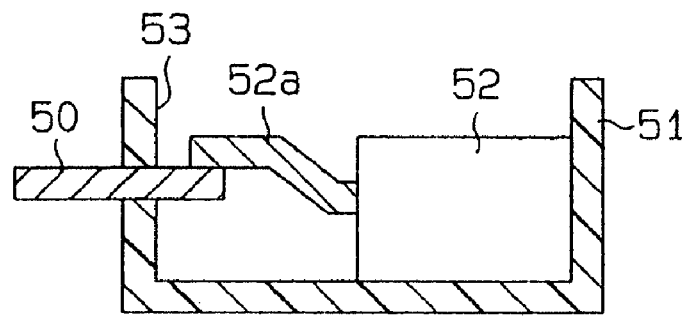
FIG. 3A is a schematic cross-sectional view showing a prior art manufacturing process before the sealant is applied.
Figure 3B:
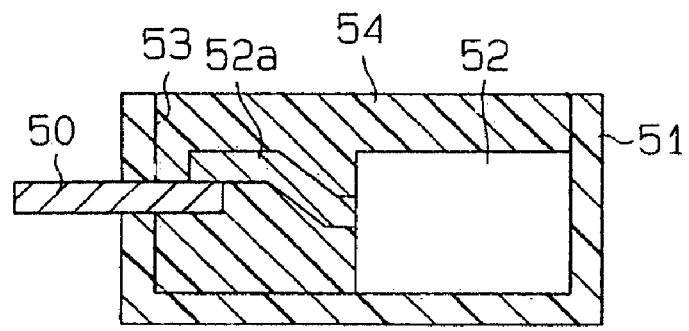
FIG. 3B is a schematic cross-sectional view showing a prior art manufacturing process after the sealant is applied.

As shown in FIGS. 1A and 1B, a semiconductor device 11 includes a housing 12. The housing is generally rectangular solid in shape and is formed of thermoplastic resin. In this embodiment, the housing 12 is formed of polyamide (PA). As shown in FIG. 1B, a semiconductor package 13 is sealed in the housing 12. The package 13 is generally also rectangular solid in shape and is formed of thermosetting epoxy resin. The surface 13a of the package 13 is modified by ultraviolet (UV) irradiation. Specifically, the modified face 13a of the package 13 has adhesive properties to the polyamide. A plurality (two in this embodiment) of connector terminals 14 extends from the package 13 in parallel. Each terminal 14 extends out of the housing 12 with one end of each terminal being sealed in the housing 12 together with the package 13.

A manufacturing process of the above-mentioned semiconductor device 11 is described with reference to FIG. 2.

First, the package 13 is formed of thermosetting epoxy resin by a conventional method. Next, the overall surface of the package 13 is irradiated by ultraviolet light. This irradiation modifies the surface of the package 13 to make it adhesive to polyamide.

The package 13 is then placed into a die 20. The die 20 includes an upper die 20a and a lower die 20b. The dies 20a, 20b each have a cavity that face to each other so that a space 15 is defined in the die 20 when the die halves 20a, 20b are positioned properly. The dies 20a, 20b have a semi-cylindrical recess at their opposing end. When the upper die 20a is positioned on the lower die 20b, the two recesses form cylindrical holes 20c. The internal diameter of the holes 20c is designed to be approximately the same as the external diameter of the terminals 14. When package 13 is placed in the die 20 in a predetermined position, the terminals 14 that extend from the package 13 are guided through the holes 20c out of the die 20.

Then, melted thermoplastic resin (PA in this embodiment) is poured through a gate 20d provided in the upper die 20a into the space 15. Thus, the housing 12 is insert molded. The temperature at which the thermoplastic resin melts is lower than or the same as the temperature at which integrated circuit (IC) chips (not shown) in the package 13 show heat resistance. After the thermoplastic resin poured into the space 15 is cooled and hardened, the upper and lower dies 20a, 20b are opened. As shown in FIG. 1B, the housing 12 is formed with the package 13 and a part of the terminals 14 sealed. The semiconductor device 11 is completed.

The above-mentioned embodiment has the following advantages.

The semiconductor device 11 can be manufactured in one step by insert molding. In other words, the conventionally required steps in the prior art (i.e. forming the housing, adhering the semiconductor package to the housing, and filling the housing with the sealant) are abbreviated in the present invention. Thus, the number of manufacturing steps is reduced and the semiconductor device 11 can be easily and inexpensively produced.

The surface of the package 13 is UV-irradiated and modified to have adhesive properties to polyamide. The modified face 13a ensures the adhesiveness between the housing 12 and the package 13. Thus, an invasion of moisture from the gap between the terminal 14 and the housing 12 is prevented (and the integrity of the semiconductor device 11 is maintained). Thus, conventional problems in the prior art, such as leaks or shorts, are avoided.

A single polyamide is used as a thermoplastic resin. This improves the adhesive properties between the package 13 and the housing 12 compared with those when a polymer alloy of polyamide and another resin is used.

It should be apparent to those skilled in the art that the present invention may be embodied in many other specific forms without departing from the spirit or scope of the invention. Particularly, it should be understood that the invention may be embodied in the following forms.

The thermoplastic resin that forms the housing 12 is not limited to single PA. For example, a resin of polymer alloy of PA and polyphenylene sulfide (PPS) can be used. The combination of PPS with PA improves heat resistance and dimensional stability and provides a low water absorption rate of the semiconductor device 11 compared with single PA, while keeping the adhesive properties between the package 13 and the housing 12.

A resin of polymer alloy of PA and polybutylene telephthalate (PBT) may also be used. The combination of PBT with PA provides a lower water absorption rate and abrasion resistance compared with single PA.

The terminal 14 may be a male connector.

The number of terminals 14 is not limited to two but may be one or more than two.

The shape of the housing 12 and the package 13 is not limited to generally rectangular solid buy may be varied in any suitable form.

Therefore, the present examples and embodiments are to be considered as illustrative and not restrictive and the invention is not to be limited to the details given herein. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated. It will be understood by one of ordinary skill in the art that numerous variations will be possible to the disclosed embodiments without going outside the scope of the invention as disclosed in the claims.

We claim:

1. A method of making a semiconductor device comprising:
    (a) UV-irradiating a semiconductor package formed of thermosetting epoxy resin to modify its surface to be adhesive to polyamide;
    (b) placing said semiconductor package in a die; and
    (c) filling a space in said die with melted polyamide or a melted thermoplastic resin including polyamide to seal said semiconductor package by insert molding, wherein said melted polyamide or thermoplastic resin including polyamide hardens to form a housing around said semiconductor package.

2. A method according to claim 1, wherein the thermoplastic resin is a polymer alloy of polyamide and polyphenylene sulfide.

3. A method according to claim 1, wherein the thermoplastic resin is a polymer alloy of polyamide and polybutylene telephthalate.

* * * * *